United States Patent
Behammer

(10) Patent No.: US 7,041,541 B2
(45) Date of Patent: May 9, 2006

(54) METHOD FOR PRODUCING A SEMICONDUCTOR COMPONENT, AND SEMICONDUCTOR COMPONENT PRODUCED BY THE SAME

(75) Inventor: Dag Behammer, Ulm (DE)

(73) Assignee: United Monolithic Semiconductors GmbH, Ulm (DE)

(*) Notice: Subject to any disclaimer, the term of this patent is extended or adjusted under 35 U.S.C. 154(b) by 105 days.

(21) Appl. No.: 10/483,433

(22) PCT Filed: Apr. 16, 2003

(86) PCT No.: PCT/EP03/03979

§ 371 (c)(1),
(2), (4) Date: Jan. 9, 2004

(87) PCT Pub. No.: WO03/096399

PCT Pub. Date: Nov. 20, 2003

(65) Prior Publication Data

US 2004/0157423 A1    Aug. 12, 2004

(30) Foreign Application Priority Data

May 11, 2002  (DE) ............... 102 20 999
Feb. 6, 2003  (DE) ............... 103 04 722

(51) Int. Cl.
 *H01L 21/338* (2006.01)
(52) U.S. Cl. .............. 438/182; 438/666; 438/672; 438/43; 438/589; 438/FOR 347
(58) Field of Classification Search .......... 438/666, 438/672, FOR. 347, 43, 182, 589
See application file for complete search history.

(56) References Cited

U.S. PATENT DOCUMENTS

| | | | | |
|---|---|---|---|---|
| 5,139,968 A * | 8/1992 | Hayase et al. | ............ | 438/577 |
| 5,155,053 A | 10/1992 | Atkinson | | |
| 5,240,869 A * | 8/1993 | Nakatani | ............ | 438/167 |
| 5,304,511 A * | 4/1994 | Sakai | ............ | 438/577 |
| 5,399,896 A * | 3/1995 | Oku | ............ | 257/412 |
| 5,585,289 A * | 12/1996 | Kitano | ............ | 438/185 |
| 5,960,269 A | 9/1999 | Kuesters et al. | | |
| 6,274,893 B1 * | 8/2001 | Igarashi et al. | ............ | 257/192 |
| 6,294,802 B1 | 9/2001 | Unozawa | | |
| 6,307,245 B1 | 10/2001 | Kunii et al. | | |
| 6,686,616 B1 * | 2/2004 | Allen et al. | ............ | 257/280 |
| 2001/0022643 A1 | 9/2001 | Kim et al. | | |

FOREIGN PATENT DOCUMENTS

| | | |
|---|---|---|
| DE | 4334427 | 4/1994 |
| DE | 19533291 | 3/1996 |
| DE | 19548058 | 6/1997 |
| EP | 0370428 | 5/1990 |
| EP | 0591608 | 4/1994 |
| EP | 1096557 | 5/2001 |
| EP | 1249862 | 10/2002 |
| FR | 2758207 | 7/1998 |
| JP | 11074348 | 3/1999 |
| JP | 2001274377 | 10/2001 |

* cited by examiner

*Primary Examiner*—George Fourson
*Assistant Examiner*—Thanh Van Pham
(74) *Attorney, Agent, or Firm*—Collard & Roe, P.C.

(57) ABSTRACT

A method for producing a gate head which can be precisely scaled and for reducing parasitic capacities, for a semiconductor component comprising an at least approximately T-shaped electrode.

19 Claims, 6 Drawing Sheets

Figure 4:
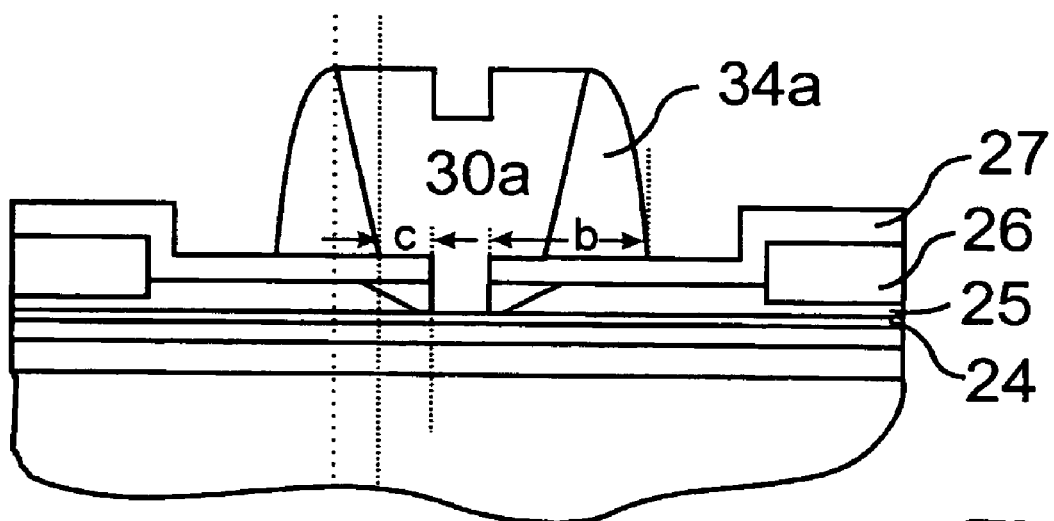

Fig. 1a
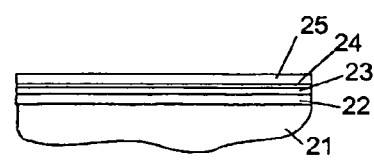
Fig. 1b
Fig. 1c
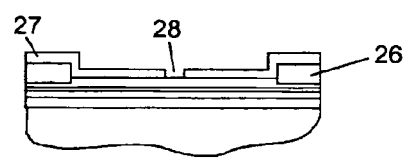
Fig. 1d
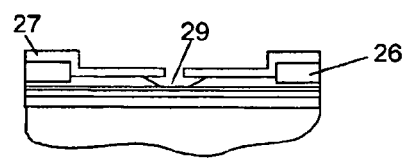
Fig. 1e
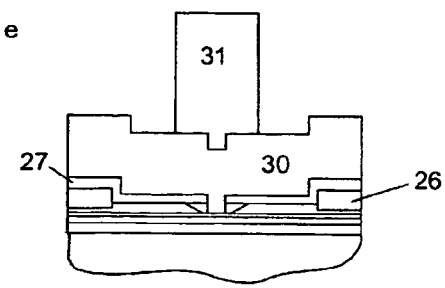
Fig. 1f
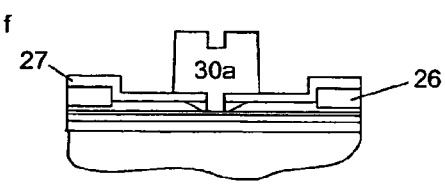
Fig. 1g
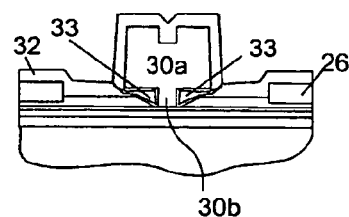
Fig. 1

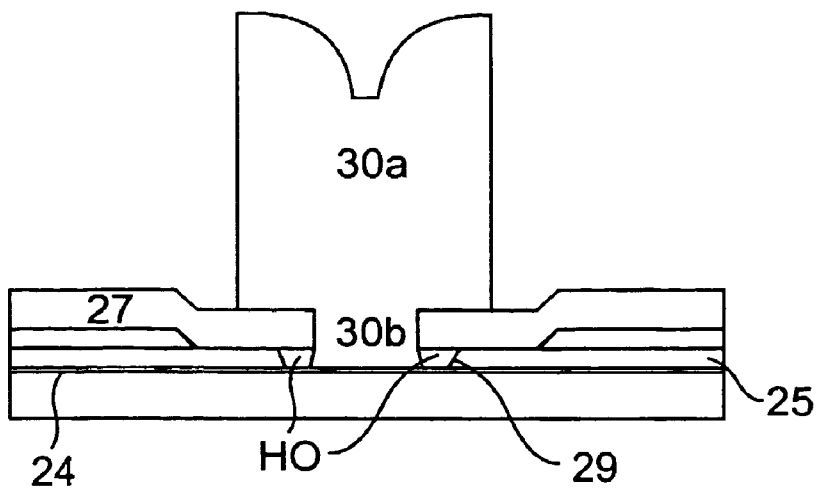
Fig.2a
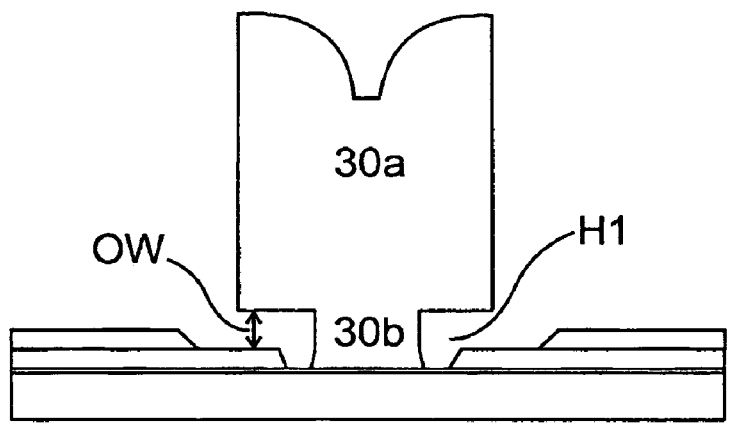
Fig.2b
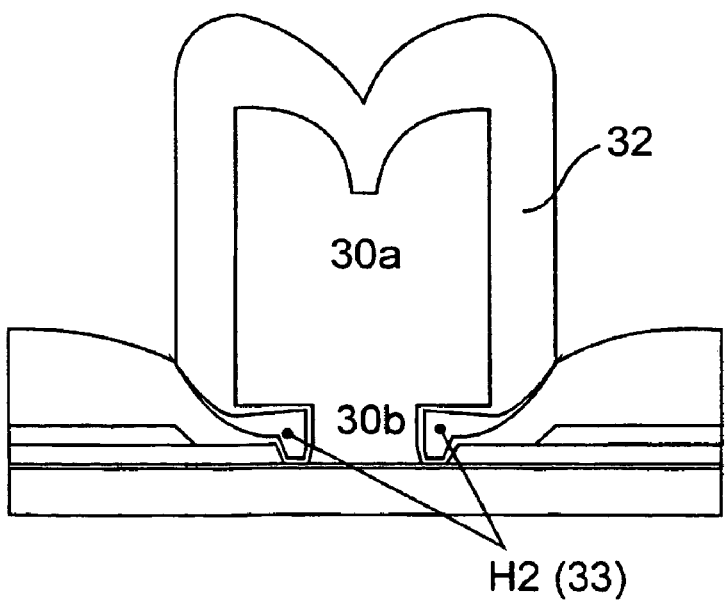
Fig.2c
Fig.2

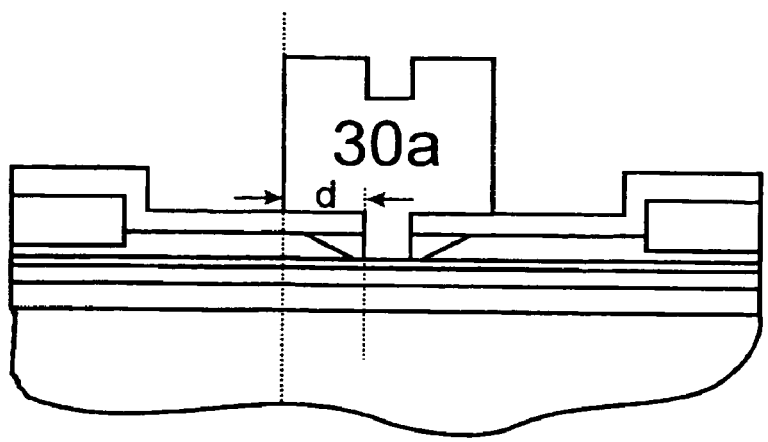
Fig. 3a
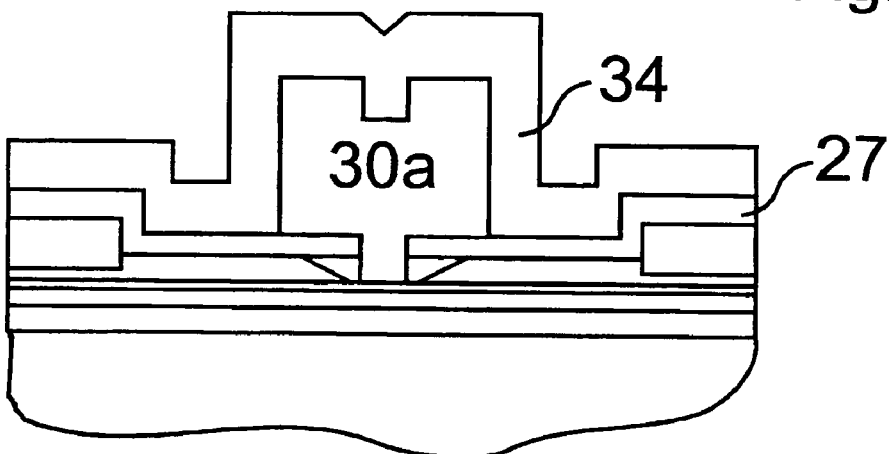
Fig. 3b
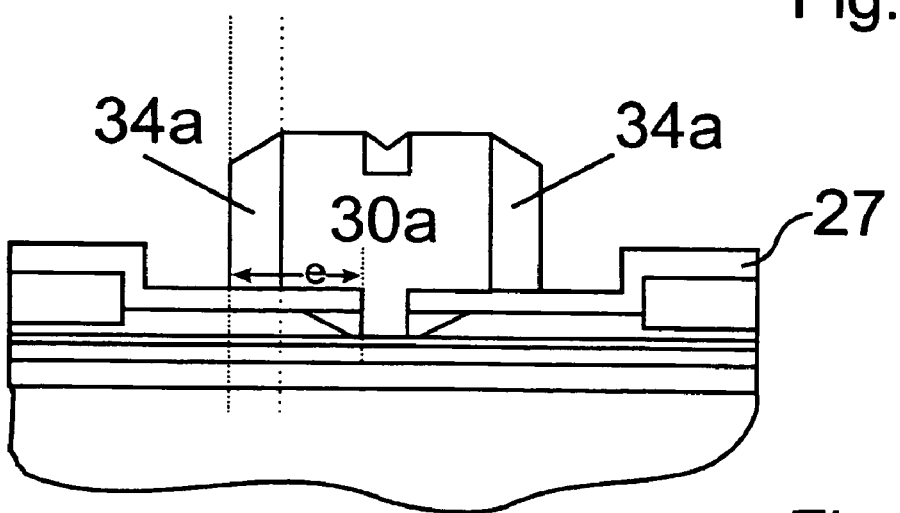
Fig. 3c
Fig. 3

METHOD FOR PRODUCING A SEMICONDUCTOR COMPONENT, AND SEMICONDUCTOR COMPONENT PRODUCED BY THE SAME

CROSS REFERENCE TO RELATED APPLICATIONS

Applicants claim priority under 35 U.S.C. §119 of German Application No. 102 20 999.5 filed on May 11, 2002 and German Application No. 103 04 722.0 filed on Feb. 6, 2003. Applicants also claim priority under 35 U.S.C. §365 of PCT/EP03/03979 filed on Apr. 16, 2003. The international application under PCT article 21(2) was not published in English.

The invention relates to a method for producing a semiconductor component, as well as to a semiconductor component, particularly one produced according to such a method.

In the production of semiconductor components, particularly field effect transistors in compound semiconductor materials, an electrode, particularly a transistor gate electrode having a narrow electrode flow of <300 nm, in some instances and, in comparison, a broad, typically at least twice as wide electrode head, is produced on a semiconductor region, whereby a recess ditch is frequently etched into the semiconductor region. Depending on the method of procedure in the production of the metallic electrode, the latter has a shape that is referred to as a T shape, a Y shape, an A shape or, with a domed underside, also as a champagne-glass shape.

U.S. Pat. No. 5,155,053 describes a method for the production of such a metallic electrode, in which an opening having the structure of the electrode foot is produced in a cover layer. The shape of the electrode foot is produced in a polymer layer under the opening, using dry etching, and the structure of the opening is continued as the structure of the electrode foot, up to the semiconductor region. After removal of the cover layer, the electrode metal is deposited onto the polymer layer and into the exposed structure for the electrode, over the entire area. The metal deposited onto the polymer layer is removed, together with the polymer layer, by means of a lift-off process. The method of procedure is simple, and is advantageous with regard to the self-adjusting alignment of the electrode head and the electrode foot. The particle formation during metal deposition can be disadvantageous, particularly when using aluminum for the metallic electrode, particularly since it can result in non-uniform edges of the metal layer on the polymer layer and therefore in a non-uniform shape of the electrode, as can the lift-off procedure with possible residues.

In U.S. Pat. No. 5,960,269, the gate metallization is formed in two steps. First, a spacer is produced on the insides of the ditch formed by the recess and the SiN mask. After metal filling, the source, drain, and gate contact regions are formed by means of planarization and back-etching, in self-adjusting manner. Subsequently, the low-ohm metallization is applied. The Y shape in the gate foot region results from the shape of the spacers. A disadvantage of this method is the spacer etching on the open recess, the use of a lift-off process for gate metallization, and the back-coupling capacitance of the gate to the source and the drain, which is great at first, as long as the dielectric is completely maintained underneath the gate head. This back-coupling can be reduced by means of the use of different ancillary layers, which are removed again, in part, after the definition of the gate head, which use is also shown.

In EP 0 370 428, the gate head and the gate foot are defined in self-adjusting manner relative to one another, using a multi-layer resist system. In this connection, an inorganic masking layer is under-etched, by means of using an isotropic etching, in such a manner that a negative profile shape is formed. The under-etching establishes the size of the gate head. Subsequently, the masking layer masks the etching of the stop layer between the polymer layers and the gate foot. By means of removing the masking layer, the gate head masking is exposed, the gate metal is vapor-deposited and subsequently lifted. The main problem of the solution described remains the use of a lift-off process for defining the gate.

It is a disadvantage of the lift-off technique, in general, that non-uniform and/or mechanically unstable regions of the electrode head can be formed in the deposition of electrode metal for the electrode head into a countersunk opening, particularly if an additional step is formed by the electrode foot. Typically, narrowing of the electrode head towards the top results from lateral closure of the opening through which the electrode metal is deposited.

The present invention is based on the task of indicating a method of the type stated initially, which guarantees reliably defined electrode shapes having advantageous electrical properties, stable over a long period of time, of the semiconductor component, particularly one produced according to such a method.

Solutions according to the invention are described in the independent claims. The dependent claims contain advantageous embodiments of the invention. In the following, the invention will be explained in greater detail on the basis of the production of a preferably T-shaped gate electrode of a field effect transistor, without being limited to this.

The deposition of a continuous metal layer over an entire area, on a protective layer above the surface of the semiconductor material, including the opening etched in the protective layer for the gate foot, with recess under-etching, results in a uniform metal layer having a precisely adjustable thickness. The subsequent etching of the structure of the electrode head in this continuous metal layer results in a cross-sectional shape of the gate head having smooth side flanks and a precisely adjustable width. In addition, a defined incline of the side flanks, particularly also in the shape of a narrowing of the gate head from the top towards the gate foot, can also be achieved by way of the parameters of the etching step.

The deposition of a continuous metal layer over an entire area, with subsequent etching of the gate head, is particularly advantageous in connection with the use of aluminum for the metallic gate, since the continuous layer is deposited at a high level of uniformity, and aluminum can be structured in precise and simple manner, particularly anisotropically in a Cl plasma. The gate thread of the transistor can therefore be precisely structured over its entire length, in contrast to the irregularity of Al tracks resulting from the closure of the opening in the masking layer in the case of lift-off processes, which is typical for aluminum.

The protective layer, which is preferably applied in an early stage of the production method for the component, is selectively dissolved to form semiconductor material and gate metal. The semiconductor surface of the recess ditch around the gate foot that is exposed in this connection is provided with a passivation layer, which is essential for the long-term-stability properties of the component. Furthermore, the passivation layer protects the semiconductor surface of the recess region during the subsequent steps of the production method for the component. The passivation layer can advantageously contain a nitride, particularly $Si_3N_4$. The passivation layer is advantageously also deposited onto the gate metal, thereby making it possible to avoid uncontrolled oxidation of the metal surface, particularly when using aluminum for the metal gate.

The protective layer can consists of different materials that are suitable for the function of protecting the semiconductor surface and any contacts for the source and drain of the transistor that have preferably already been produced on it, including resist layers. A protective layer composed of nitride, particularly $Si_3N_4$, the thickness of which can be adjusted with great precision, is particularly advantageous, so that the vertical distance of the underside of the gate head from the semiconductor surface in the recess ditch and, if applicable, to the side of it, can be adjusted in precise and reproducible manner. This distance is of particular importance for the parasitic capacitance between the source and the gate, and between the gate and the drain of a field effect transistor.

These parasitic capacitances can advantageously be reduced in that the cavity surrounded by the semiconductor surface of the recess ditch, by the gate foot, and by the underside of the gate head, on several sides, which is open towards a side that faces away from the gate foot after the protective layer has been removed, is not completely filled with the material of the passivation layer, but also is not left completely open and unfilled, but rather is permanently filled in defined manner, with a dielectric having a low dielectricity constant.

For example, according to an advantageous embodiment, the passivation layer, which typically grows more slowly in the cavity, because of the narrow access opening to the latter, than outside the cavity, can be deposited so long, i.e. to such an extent, that the opening is closed off by the passivation layer, without the cavity being completely filled with passivation material. The cavity then remains permanently gas-filled, thereby keeping the parasitic capacitance low.

In another advantageous embodiment, the passivation layer is deposited only at a slight layer thickness, and particularly while keeping an access opening to the cavity clear. The remaining cavity is filled with a dielectric having a low dielectricity constant, particularly $\in<3.0$, which permanently remains in the cavity. Such a dielectric can particularly be introduced in the liquid state and then solidified. BCB (benzocyclobutene) is particularly suited as a dielectric. Any dielectric located outside the cavity can be removed in a manner that is suitable depending on the material, whereby an attack by the agent being used on the dielectric located in the cavity can be restricted to such an extent that the latter is removed only in the region of the cavity opening, until the dielectric located outside the cavity has been removed. Targeted filling of the cavity with a defined solid dielectric having a low dielectricity constant reliably prevents substances that generally have a higher dielectricity constant from being deposited in the cavity during subsequent steps.

The passivation layer, which can also be composed of several different materials and/or deposited in consecutive partial layers, can advantageously be deposited in a CVD (chemical vapor deposition) process, particularly also plasma enhanced (PECVD).

The geometries of the semiconductor surface, the gate foot, and the gate head are preferably adjusted in such a manner that the cavity spaced apart from the electrode foot that results after removal of the protective layer has a minimal distance between the electrode head and the semiconductor surface as an opening, the opening width of which is preferably less than the maximal vertical and/or horizontal expanse of the cavity. The dimensions of the gate head in this sense can be enlarged with regard to the underside width of the gate head, as compared with the pure metal gate, in that lateral additional layers (spacers) are deposited on the etched flanks of the electrode head, before removal of the protective layer, which permanently remain on the side flanks and, in particular, can also be covered by the passivation layer. Such lateral additional layers can, in particular, be combined, in connection with a metallic gate head that narrows downwards, whereby particularly low parasitic capacitances result from the metallic underside that has been reduced in size, on the one hand, and the reliable cavity formation under the metal and the lateral additional layers of the gate head, on the other hand. Preferably, the gate head has an underside surface around the gate foot, which runs parallel to the layer planes of the semiconductor layer. In the case of such a preferred structure, the capacitances between the gate and source or drain of a field effect transistor are particularly critical.

According to a preferred embodiment, the structure of the opening for the electrode foot can be defined by means of a spacer deposited on a side flank of an ancillary layer. The spacer technique, which is known as such, allows a particularly precise adjustment of the width of the gate foot for very small gate lengths.

The method steps according to the invention can advantageously be concentrated on a method segment relating to the production of the gate electrode, so that during the remainder of the method sequence, the conventional and proven method steps can be taken over unchanged, to a great extent.

Figure 5:
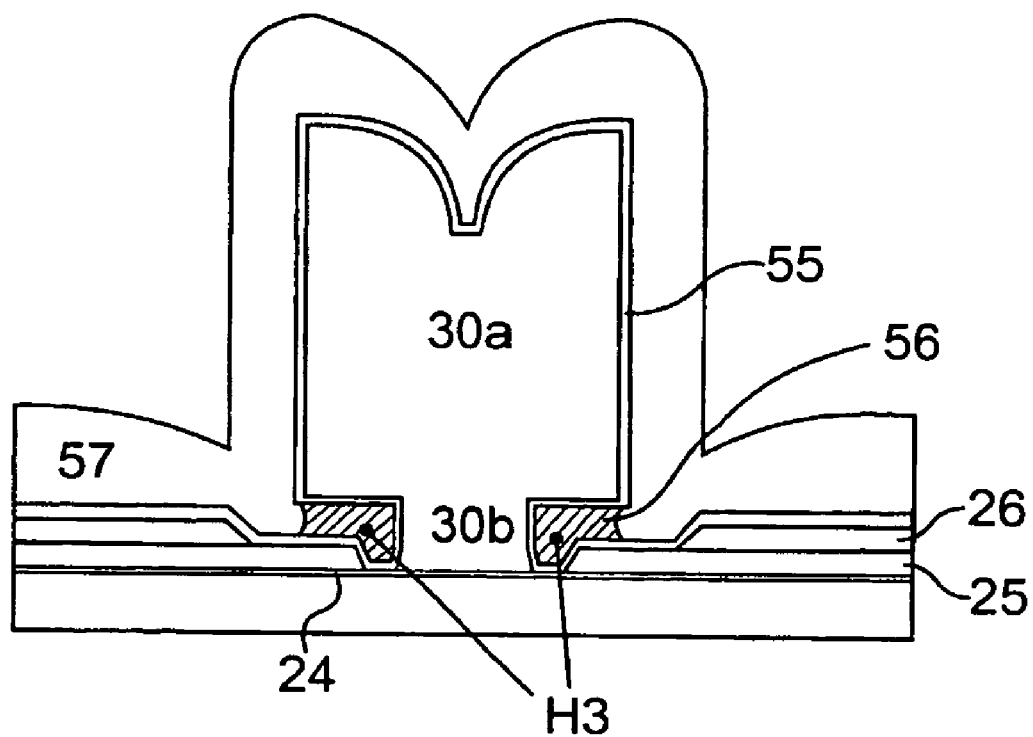

The invention will be explained in greater detail below, using preferred exemplary embodiments and making reference to the drawings. These show:

FIG. 1 several steps of a method for the production of a component according to the invention, FIG. 2 detail enlargements relating to the production of a metallic gate electrode, FIG. 3 the production of a widened gate head, FIG. 4 an alternative embodiment to FIG. 3, FIG. 5 an embodiment having a cavity filled in targeted manner, FIG. 6 the production of a structure of the electrode foot.

FIG. 1 shows the production of an HEMT (high electron mobility transistor) on a GaAs compound semiconductor material in several steps. Proceeding from the GaAs substrate 21, the layers 22–25 define the vertical profile of the transistor, which is greatly dependent on the use in terms of its thickness and element structure. Fundamentally, 22 represents the buffer, 23 forms the two-dimensional electron gas (channel), 24 is a stop layer that contributes to the defined etching of the recess ditch, and 25 is the highly doped contact layer (FIG. 1a). After definition of the ohm contacts 26 for source and drain in FIG. 1b, PECVD deposition of the $Si_3N_4$ layer 27 as a protective layer takes place, into which an opening 28 having the structure of the gate foot is etched (FIG. 1c). Subsequently, as shown in FIG. 1d, wet or dry chemical etching takes place for structuring the recess ditch 29, by means of under-etching the opening 28 in the contact layer 25 and whole-area deposition of the gate material 30. This material consists, in an advantageous embodiment, predominantly of vapor-deposited or sputtered Al having an adhesive layer and a cover layer, for example made of titanium. Depending on the use, additional diffusion barriers such as TaN, WTi, or TiN, can also be applied, but it should preferably be possible to structure them using dry chemical methods. Subsequent structuring of the gate metal 30 for producing the metallic gate head is masked by the photoresist 31 (FIG. 1e), so that after the resist is removed, the structure 30a is formed as a metallic gate head (FIG. 1f). The gate foot is referred to as 30b. Subsequently, the protective layer 27 is removed in a plasma that contains fluorine ($CF_4/O_2$, $SF_5/O_2$), preferably using dry chemical methods. Subsequently, the entire arrangement is covered with a passivation layer 32. As a result of the overhanging gate structure, cavities 33 are formed (FIG. 1g), which reduce the back-coupling capacitance between the gate and the source and the drain.

The shape of the gate electrode, having an underside of the gate head that is parallel to the semiconductor layer planes, is particularly advantageous. This shape results from deposition of the gate metal onto a layer or layer sequence that covers the semiconductor layers around the gate foot, having a level surface in this region, whereas in the case of the Y shape or the champagne-glass shape, the underside is primarily determined by rounded lateral flanks of a surrounding layer.

In FIG. 2a to 2c, the method segment after etching of the gate head 30a according to FIG. 1f is shown on a larger scale. The dimensions should not be considered to be true to scale. In the etched recess ditch, there is a cavity 40 between gate foot 30b, recess ditch 29, and protective layer 27, but the semiconductor surface of the recess ditch is exposed in this cavity. The protective layer 27 is removed as described, so that in FIG. 2, a cavity H1 is present between gate head 30a, gate foot 30b, and the semiconductor surface of the recess ditch 29, which cavity has an opening having a minimal opening width OW on its side facing away from the gate foot. The opening width OW is preferably less than the maximal expanse of the cavity parallel and perpendicular to the semiconductor layers.

A passivation layer 32 deposited from the gas phase, particularly according to PECVD, is precipitated outside and inside of the cavity H1, whereby the layer growth in the cavity H1 is clearly weaker than outside of the cavity, because of the small opening width OW, and also continues to decrease rapidly, since the opening closes up. The passivation layer is deposited so long, i.e. to such an extent, that the passivation layer closes up from two sides in the entrance to the cavity, and forms a closed, reduced cavity H2, which remains permanently closed and gas-filled.

The passivation layer 15 in FIG. 2c can also be composed of different materials, which are, for example, deposited in partial layers, one after the other. Preferably, nitride is selected as the material that is deposited first.

In FIG. 3, as a further development of the invention, an additional method segment is provided between the etching of the metallic gate head (FIG. 3a, FIG. 1f, FIG. 2a) and the removal of the protective layer 27, in that dielectric additional layers, e.g. of the type of so-called spacers, are produced after etching of the gate head, on its side flanks, which layers enlarge the horizontal expanse of the underside of the gate head that has been widened in this manner, from the dimension d according to FIG. 3a, to the dimension e in FIG. 3c. For this purpose, a layer 34 applied over the whole area in FIG. 3b, e.g. an oxide layer, can be removed except for residual layers 34a on steep side flanks, by means of anisotropic etching, as is known from methods for the production of spacers. Because of the great depth e of the cavity H1 that is formed under the gate head after removal of the protective layer 27, the passivation layer 15 is deposited in this cavity only in a slight thickness, so that a large cavity H2 remains and, accordingly, the parasitic capacitances remain small. The growth of the lateral additional layers is particularly advantageous for a shape of the metallic gate head in which a narrowing of the metallic gate head downwards, i.e. towards the gate foot, is formed, by means of corresponding adjustment of the etching parameters in the etching of the metallic gate head from the continuous metal layer 30, as shown in FIG. 4. Primarily, here the underside of the gate head is only active for the parasitic capacitances over a width dimension c above the cavity, and even this effect is further weakened by means of the horizontal depth b, preferably b>1.5 c of the cavity H1 under the spacers 34a, and the deposition of the passivation layer at only a slight layer thickness in the cavity. In the case of strong under-etching, the lateral additional layers can also be limited to the projection under the overhang and produced by means of vertical anisotropic etching. During the production of the spacers, the semiconductor surface is protected by the protective layer 27.

In another advantageous embodiment, the cavity H1 surrounded on several sides by gate head, gate foot, and recess ditch is closed off not by means of closure of the opening, but rather the passivation layer 55 is applied in only a slight thickness, as shown in FIG. 5 and, in particular, the opening that faces away from the gate foot is left open so wide that a dielectric having a low electricity constant $\in$, particularly $\in < 3.0$, can be introduced into the cavity H3, essentially completely filling the latter, and solidified there. Preferably, BCB is selected as a dielectric, which is applied to the surface of the arrangement in liquid form after deposition of the thin passivation layer 55, preferably nitride, and penetrates into the cavity. The dielectric can, for example, be solidified by means of the effect of temperature. The removal of dielectric deposited outside the cavity can be adjusted in such a way that the dielectric 56 is maintained in the cavity, to a great extent, as shown in FIG. 5.

It is advantageous if after the cavity is filled and, if necessary, the dielectric 56 is solidified in the cavity and/or the dielectric is removed from outside the cavity, an additional passivation layer 57, which again contains nitride and/or oxide, for example, can be applied, which particularly protects the dielectric deposited in the cavity H3 against the effect of solvents and etching agents during subsequent processes.

FIG. 6 illustrates a preferred embodiment of a method segment for defining the structure of the electrode foot. Proceeding from the GaAs substrate 1, the layers 2–5 represent the vertical profile of the transistor, which is dependent on the use in terms of its thickness and element structure. Fundamentally, 2 represents the buffer, 3 forms the two-dimensional electron gas (the channel), 4 is a stop layer that contributes to defined etching of the recess ditch, and 5 is a highly doped contact layer (FIG. 6a). After the ohm contacts 6 have been defined in FIG. 6b, deposition of the protective layer 7 takes place, preferably PECVD-$Si_3N_4$, followed by application of the metallic stop layer 8 (see FIG. 6c). Subsequently, the temperature-stable resist layer 9 (e.g. PMGI, PMMA or polyamide) and the inorganic layer 10 are applied, into which the structure 10b is transferred by means of reactive ion etching (RIE), through the photoresist mask 11b. The mask 10b then masks the dry-chemical plasma etching of the temperature-stable resist layer 9 and thereby defines the structure 9b, which is characterized by a high flank steepness and does not have a resist foot at the transition to the stop layer 8 (see FIGS. 6d and 1e). Both properties can be produced by means of suitable parameters of the RIE etching used. After removal of the mask 10b, PECVD deposition of the oxide layer 12a takes place, which forms a spacer 12b as the result of subsequent anisotropic etching at the resist edge. Depending on the topography of the ohm contacts 6, additional parasitic spacers 12c can be formed (FIGS. 6f and 1g). After removal of the temperature-stable resist layer 9 (FIG. 6b), the regions 13, in which the oxide spacer is supposed to be maintained, are protected by means of a photo step, while the parasitic spacers are removed. The structure size and the adjustment of 13 to 12b are very non-critical (FIG. 6i).

Figure 6A:
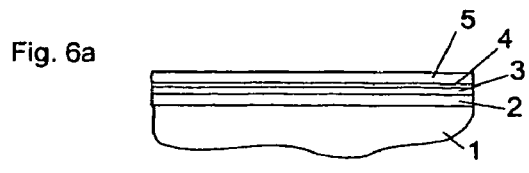
Figure 6B:
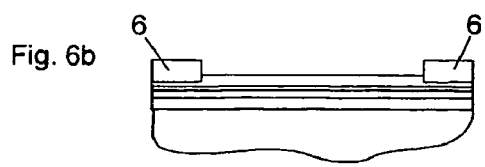
Figure 6C:
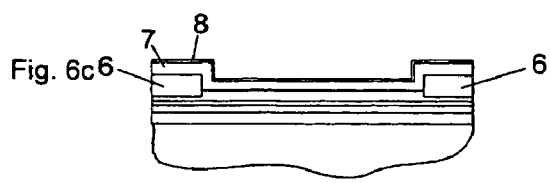
Figure 6D:
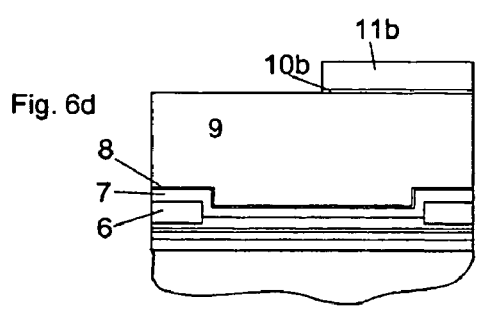
Figure 6E:
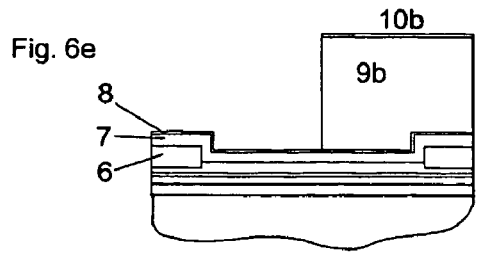
Figure 6F:
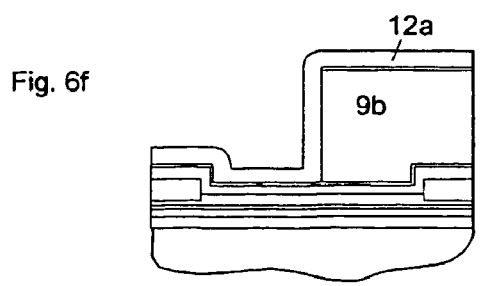
Figure 6G:
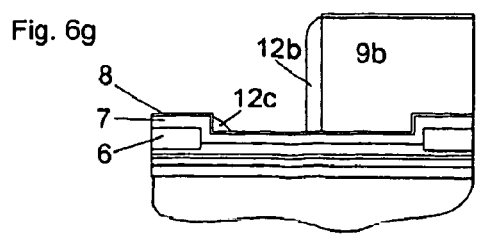
Figure 6H:
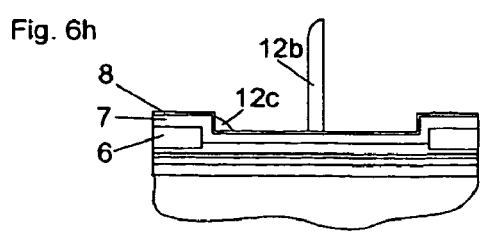
Figure 6I:
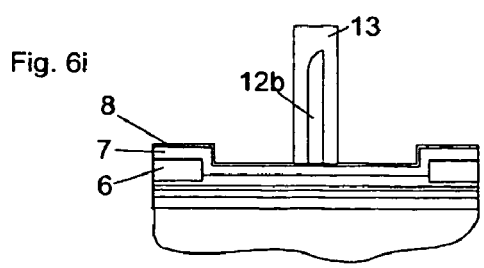
Figure 6J:
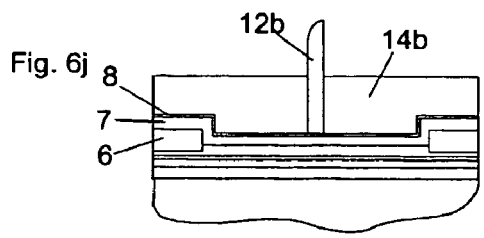
Figure 6K:
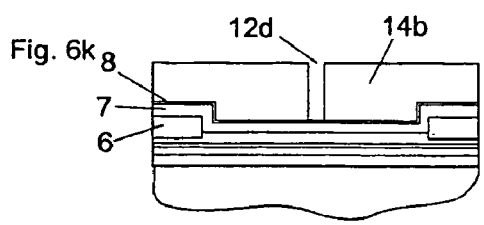
Figure 6L:
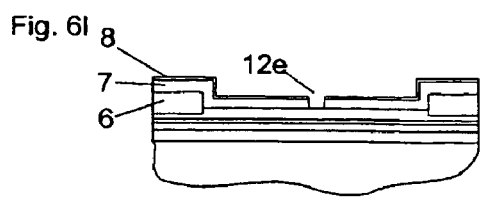

An additional resist layer 14 makes the surface flat, and after homogeneous dry-chemical resist dilution, the back-etched resist layer 14b remains, above which the top part of the spacer 12b is exposed (FIG. 6j). The spacer can also be partly removed. Subsequently, the spacer is removed selectively relative to the photoresist 14b, so that a ditch 12d is formed in the photoresist (FIG. 6k), which masks the subsequent etching of the stop layer 8 and the protective layer 7, to produce the opening 12e. After removal of the remaining photoresist 14b, the situation shown in FIG. 6l results, followed by the steps known from the main patent, with deposition of a metal layer over the entire area, its masking with the structure for the electrode head, and clear etching of the metal layer around the electrode head, up to the protective layer 7.

The characteristics indicated above and in the claims as well as evident from the figures can be advantageously implemented both individually and in various combinations. The invention is not limited to the exemplary embodiments described, but rather can be modified in many different ways, within the scope of the abilities of a person skilled in the art. In particular, materials other than the ones mentioned in an individual case can be used, and different geometries can be selected.

The invention claimed is:

1. Method for producing a semiconductor component, in which a recess ditch is produced through an opening of a protective layer, in an underlying semiconductor region, and a narrow electrode foot and, above it, a broader electrode head of a metallic electrode are produced through the opening of the protective layer, wherein the electrode metal for the electrode foot and the electrode head is deposited continuously onto the protective layer, over its entire area, and in its opening, wherein the structure of the electrode head is etched in the metal layer, up to the protective layer, wherein afterwards the protective layer is removed, and at least the semiconductor surface of the recess ditch is covered with a passivation layer, and wherein the passivation is allowed to grow so long, i.e. so thick that the space surrounded on several sides by the semiconductor region, the electrode foot, and the electrode head, and facing towards a side facing away from the electrode foot, which was originally open, is closed off by the material and has a cavity not filled by passivation material.

2. Method according to claim 1, wherein the protective layer comprises a nitride.

3. Method according to claim 1, wherein the passivation layer comprises at least in part of nitride.

4. Method according to claim 1, wherein the passivation layer is deposited in a CVD process.

5. Method according to claim 1, wherein the electrode foot and/or the electrode head is/are produced at least predominantly of aluminum.

6. Method according to claim 1, wherein the passivation layer is also deposited on the surface of the electrode.

7. Method according to claim 1, wherein the cavity contains a dielectric fill material with $\in < 3.0$.

8. Method according to claim 7, wherein BCB (benzocyclobutene) is selected as the fill material.

9. Method according to claim 1, wherein the cavity is essentially gas-filled.

10. Method according to claim 1, wherein dielectric layers are deposited on the side flanks of the electrode head before removal of the protective layers.

11. Method according to claim 1, wherein the etching for structuring the electrode head is carried out in such a manner that the electrode head narrows downwards.

12. Method for producing a semiconductor component, in which a recess ditch is produced through an opening of a protective layer, in an underlying semiconductor region, and a narrow electrode foot and, above it, a broader electrode head of a metallic electrode are produced through the opening of the protective layer, wherein the electrode metal for the electrode foot and the electrode head is deposited continuously onto the protective layer, over its entire area, and in its opening, wherein the structure of the electrode head is etched in the metal layer, up to the protective layer, wherein afterwards the protective layer is removed, and at least the semiconductor surface of the recess ditch is covered with a passivation layer, wherein the passivation layer is allowed to grow only to such an extent that the cavity surrounded on several sides by semiconductor region, electrode foot, and electrode head remains open towards a side facing away from the electrode foot, and wherein dielectric fill material is filled into the cavity through the opening.

13. Method according to claim 12, wherein the fill material is removed again from outside the cavity.

14. Method according to claim 12, wherein the fill material is solidified in the cavity.

15. Method for producing a semiconductor component, in which a recess ditch is produced through an opening of a protective layer, in an underlying semiconductor region, and a narrow electrode foot and, above it, a broader electrode head of a metallic electrode are produced through the opening of the protective layer, wherein the electrode metal for the electrode foot and the electrode head is deposited continuously onto the protective layer, over its entire area, and in its opening, wherein the structure of the electrode head is etched in the metal layer, up to the protective layer, wherein afterwards the protective layer is removed, and at least the semiconductor surface of the recess ditch is covered with a passivation layer, and wherein in order to produce the opening for the electrode foot on the protective layer, a spacer is produced on a vertical material edge of a first intermediate layer, a second intermediate layer is deposited around the spacer, the spacer is removed from the second intermediate layer and the opening that is formed in the second intermediate layer in this connection is used as a mask for producing the opening in the protective layer.

16. Method according to claim 15, wherein an etching stop layer is deposited on the protective layer and the spacer is produced on this etching stop layer, whereby the spacer material can be selectively etched relative to the etching stop layer, during removal of the spacer.

17. Method according to claim 16, wherein a metal layer is deposited as the etching stop layer.

18. Method according to claim 15, wherein the first intermediate layer is removed before deposition of the second intermediate layer.

19. Method according to claim 15, wherein the second layer is removed from a initial layer thickness to a reduced layer thickness, which is less than the height of the spacer.

* * * * *

UNITED STATES PATENT AND TRADEMARK OFFICE
CERTIFICATE OF CORRECTION

PATENT NO. : 7,041,541 B2 Page 1 of 1
APPLICATION NO. : 10/483433
DATED : May 9, 2006
INVENTOR(S) : Behammer It is certified that error appears in the above-identified patent and that said Letters Patent is hereby corrected as shown below:

In Column 8, line 64, (Line 2 of Claim 19), after the word "from" please change "a" to correctly read: --an--.

Signed and Sealed this

Fifth Day of December, 2006

JON W. DUDAS
*Director of the United States Patent and Trademark Office*